United States Patent [19]

Pampalone

[11] Patent Number: 5,143,814
[45] Date of Patent: * Sep. 1, 1992

[54] POSITIVE PHOTORESIST COMPOSITIONS WITH O-QUINONE DIAZIDE, NOVOLAK AND PROPYLENE GLYCOL ALKYL ETHER ACETATE

[75] Inventor: Thomas R. Pampalone, Mendham, N.J.

[73] Assignee: Hoechest Celanese Corporation, Short Hills, N.J.

[*] Notice: The portion of the term of this patent subsequent to Oct. 29, 2002 has been disclaimed.

[21] Appl. No.: 772,976

[22] Filed: Oct. 8, 1991

Related U.S. Application Data

[60] Division of Ser. No. 501,970, Mar. 28, 1990, Pat. No. 5,066,561, which is a continuation of Ser. No. 263,968, Oct. 27, 1988, abandoned, which is a continuation of Ser. No. 914,217, Oct. 2, 1986, abandoned, which is a continuation of Ser. No. 791,252, Oct. 25, 1985, abandoned, which is a continuation-in-part of Ser. No. 619,468, Jun. 11, 1984, Pat. No. 4,550,069.

[51] Int. Cl.$^5$ .................... G03F 7/023; G03C 1/60; G03C 1/76
[52] U.S. Cl. .................... 430/165; 430/166; 430/191; 430/192; 430/193; 430/326; 430/330; 430/331
[58] Field of Search ............ 430/191, 192, 331, 326, 430/165, 193

[56] References Cited

U.S. PATENT DOCUMENTS

| | | | |
|---|---|---|---|
| 3,228,768 | 1/1966 | Straw et al. | 430/166 |
| 3,666,473 | 5/1974 | Colom et al. | 430/326 |
| 3,785,825 | 1/1974 | Deutsch et al. | 430/165 |
| 3,859,099 | 1/1975 | Petropoulos et al. | 430/191 |
| 3,868,254 | 2/1975 | Wemmers | 430/191 |
| 3,933,517 | 1/1976 | Vivian | 252/171 |
| 4,266,001 | 5/1981 | Buhr et al. | 430/192 |
| 4,267,260 | 5/1981 | Miura et al. | 430/302 |
| 4,308,368 | 12/1981 | Kubo et al. | 430/326 |
| 4,351,895 | 9/1982 | Walls | 430/331 |
| 4,355,094 | 10/1982 | Pampalone et al. | 430/286 |
| 4,377,631 | 3/1983 | Toukhy et al. | 430/192 |
| 4,378,423 | 3/1983 | Suezawa et al. | 430/303 |
| 4,381,340 | 4/1983 | Walls | 430/309 |
| 4,397,937 | 8/1983 | Clecak et al. | 430/326 |
| 4,409,317 | 10/1983 | Shiraishi | 430/270 |
| 4,411,983 | 10/1983 | Washizawa et al. | 430/325 |
| 4,416,976 | 11/1983 | Schell | 430/331 |
| 4,439,516 | 3/1984 | Cernigliaro et al. | 430/323 |
| 4,447,510 | 5/1984 | Frass et al. | 430/3 |
| 4,460,674 | 7/1984 | Uehara et al. | 430/326 |
| 4,464,461 | 8/1984 | Guild | 430/331 |
| 4,482,661 | 11/1984 | Liu | 524/906 |
| 4,496,647 | 1/1985 | Kawabe et al. | 430/303 |
| 4,510,227 | 4/1985 | Mohr et al. | 430/175 |
| 4,535,059 | 8/1985 | Brault et al. | 430/325 |
| 4,550,069 | 10/1985 | Pampalone | 430/191 |
| 4,596,763 | 6/1986 | DiCarlo et al. | 430/192 |
| 4,764,450 | 8/1988 | Ruckert et al. | 430/191 |

FOREIGN PATENT DOCUMENTS

| | | |
|---|---|---|
| 0021719 | 1/1981 | European Pat. Off. . |
| 0114126 | 7/1984 | European Pat. Off. . |
| 164248 | 12/1985 | European Pat. Off. . |
| 60-145616 | 3/1985 | Japan . |

OTHER PUBLICATIONS

Chemical Abstractsm, vol. 48, No. 13951F (1954).
Chemical Abstracts, vol. 86, No. 54765x (1977).
Chemical Abstracts, vol. 89, No. 107342c (1978).
Chemical Abstracts, vol. 94, No. 83268H (1981).
Chemical Abstracts, vol. 94, No. 44370d (1981).
Physical Org., Chem., vol. 86 (1977).
Photographic Science & Engineering, vol. 21, No. 5, pp. 290-292 (1977).
Solid State Technology, vol. 26, No. 8, pp. 211-217 (1983).
IBM Technical Disclosure Bulletin, vol. 13, No. 2, p. 530 (1970).
Hamlin, New Propylene Glycol Ethers and Acetates, Paint & Resin, Oct., 1983, at 42–47.
"Technical Data," The Arco Chemical Company, Aug., 26, 1982.

*Primary Examiner*—Charles L. Bowers, Jr.
*Assistant Examiner*—Christopher G. Young
*Attorney, Agent, or Firm*—Finnegan, Henderson, Farabow, Garrett & Dunner

[57] ABSTRACT

The invention provides a method for producing a positive working photosensitive element with increased photospeed which comprises coating a formulation containing at least one novolak or polyvinyl phenol resin, at least one o-quinone diazide and a propylene glycol alkyl ether acetate on a substrate, drying, exposing to imaging energy and developing.

24 Claims, No Drawings

POSITIVE PHOTORESIST COMPOSITIONS WITH O-QUINONE DIAZIDE, NOVOLAK AND PROPYLENE GLYCOL ALKYL ETHER ACETATE

CROSS-REFERENCE TO RELATED APPLICATION

This is a division of application Ser. No. 07/501,970, filed Mar. 28, 1990 (U.S. Pat. No. 5,066,561), which is a continuation of Ser. No. 07/263,968, filed Oct. 27, 1988 (abandoned), which is a continuation of Ser. No. 06/914,217, filed Oct. 2, 1986 (abandoned), which is a continuation of Ser. No. 06/791,252, filed Oct. 25, 1985 (abandoned), which is a continuation-in-part of Ser. No. 06/619,468, filed Jun. 11, 1984 (U.S. Pat. No. 4,550,069).

BACKGROUND OF THE INVENTION

The present invention relates generally to a process for preparing radiation sensitive positive photoresist compositions and particularly to compositions containing novolak resins together with naphthoquinone diazide sensitizing agents. It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern on the substrate.

In most instances, the exposed and developed substrate will be subject to treatment by a substrate-etchant solution or gas plasma. The photoresist coating protects the coated areas of the substrate from the etchant and thus the etchant is only able to etch the uncoated areas of the substrate, which, in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Increased photospeed is important for a photoresist, particularly in applications where a number of exposures are needed, for example, in generating multiple patterns by a repeated process, or where light of reduced intensity is employed such as, in projection exposure techniques where the light is passed through a series of lenses and mono-chromatic filters. Thus, increased photospeed is particularly important for a resist composition employed in processes where a number of multiple exposures must be made to produce a mask or series of circuit patterns on a substrate. These optimum conditions include a constant development temperature and time in a particular development mode, and a developer system selected to provide complete development of exposed resist areas while maintaining a maximum unexposed resist film thickness loss not exceeding about 10 percent of initial thickness.

Development contrast refers to a comparison between the percentage of film loss in the exposed area of development with the percentage of film loss on the unexposed area. Ordinarily, development of an exposed resist coated substrate is continued until the coating on the exposed area is substantially completely dissolved away and thus, development contrast can be determined simply by measuring the percentage of the film coating loss in the unexposed areas when the exposed coating areas are removed entirely.

Resist resolution refers to the capability of a resist system to reproduce the smallest equally spaced line pairs and intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

A problem with the use of conventional positive photoresists in the production of miniaturized integrated circuit components is that the positive resists generally have slower photospeed than the negative resists.

Various attempts have been made in the prior art to improve the photospeed of positive photoresist compositions. For example, in the U.S. Pat. No. 3,666,473, a mixture of two phenolformaldehyde novolak resins was utilized together with a typical sensitizer, said novolak resins being defined by their solubility rates in alkaline solutions of a particular pH and by their cloud points. In U.S. Pat. No. 4,115,128, a third component consisting of an organic acid cyclic anhydride was added to the phenolic resin and naphthoquinone diazide sensitizer to provide increased photospeed.

The present invention provides a process for producing an improved positive working photoresist which demonstrates substantially increased photospeed while retaining or improving the resist erosion rate, plasma etch rate, and contrast. It has been unexpectedly found that such an improved resist can be formulated when the novolak resin and quinone diazide photosensitizer are blended with a propylene glycol alkyl ether acetate component. This component also acts as a solvent for the resin and photosensitizer to facilitate the application of the resist to a substrate. This component demonstrates lower toxicity over other solvents useful for forming photoresists.

SUMMARY OF THE INVENTION

The invention provides a method for producing a photoresist which comprises forming a composition containing at least one resin selected from the group consisting of novolaks and polyvinyl phenols, and at least one o-quinone diazide photosensitizer, and a solvent composition, which solvent composition comprises a propylene glycol alkyl ether acetate; coating said composition on a substrate, drying said composition such that it is substantially non-tacky but contains residual solvent in an amount of from about 1% to about 30% based on the dried coating weight; imagewise exposing the composition to imaging energies and removing the exposed areas with an aqueous alkaline developer.

In the preferred embodiment the invention uses a positive working photosensitive composition which comprises a novolak resin, a quinone diazide photosensitizer and a sufficient amount of a propylene glycol alkyl ether acetate to increase the photospeed of said composition. Most preferably the acetate is propylene glycol methyl ether acetate.

The photoresist of the present invention, in addition to exhibiting increased photospeed in comparison with prior art positive photoresists, exhibits a high degree of resolution and good development contrast and adhesion properties. These properties are in marked contrast to some prior art resins which achieve moderately increased photospeed while at the same time sacrificing resolution and contrast.

DETAILED DESCRIPTION OF THE PREFERRED EMBODIMENT

As hereinbefore mentioned, the invention provides a composition containing a novolak or polyvinyl phenol resin, a quinone diazide photosensitizer and a propylene glycol alkyl ether acetate. A preferred acetate compound is propylene glycol methyl ether acetate.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, N.Y., 1979 in Chapter 4 which is incorporated herein by reference. Paravinyl phenols and polyvinyl phenols are described in U.S. Pat. No. 3,869,292 and U.S. Pat. No. 4,439,516, which are incorporated herein by reference. Similarly, the use of o-quinone diazides is well known to the skilled artisan as demonstrated by *Light Sensitive Systems*, Kosar, J.; John Wiley & Sons, N.Y., 1965 in Chapter 7.4 which is also incorporated herein by reference. These sensitizers which comprise a component of the process of the present invention are selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride, and naphthoquinone-(1,2)-diazide-4sulfonyl chloride condensed with phenolic compounds such as hydroxy benzophenones.

In the preferred embodiment, the solid parts of the photoresist composition, that is the resin and diazide preferably ranges from 15% to about 99% resin and from about 1% to about 85% quinone diazide. A more preferred range of resin would be from about 50% to about 90% and most preferably from about 65% to about 85% by weight of the solid resist parts. A more preferred range of the diazide would be from about 10% to about 50% and more preferably from about 15% to about 35% by weight of the solid resist parts. In manufacturing the resist composition the resin and diazide are mixed with the propylene glycol alkyl ether acetate such that the acetate is present in an amount of from about 40% to about 90% by weight of the overall resist composition. A more preferred range is from about 60% to about 83% and most preferably from about 65% to about 70% by weight of the overall resist composition.

Additives such as colorants, dyes, anti-striation agents, plasticizers, adhesion promoters, speed enhancers, solvents and such surfactants as non-ionic surfactants may be added to the solution of novolak resin sensitizer and acetate before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to five percent weight level, based on the combined weight of novolak and sensitizer.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improved the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyl-disilanemethyl methacrylate; vinyltrichlorosilane; and $\gamma$-aminopropyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Solvents may include xylene, butyl acetate and Cellosolve ® acetate and may be present in the overall composition in an amount of up to 95% by weight although preferably no additional solvents are employed in the composition.

Non-ionic surfactants that may be used include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of novolak and sensitizer The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is temperature treated at approximately 20° to 105° C. This temperature treatment is selected in order to reduce and control the concentration of residual solvents in the photoresist through evaporation while not causing substantial thermal degradation of the photosensitizer. In general one desires to minimize the concentration of solvents and thus this temperature treatment is conducted until a substantial amount of the solvents has evaporated and a thin coating of photoresist composition, on the order of a micron in thickness, remains on the substrate. This treatment is normally conducted at temperatures in the range of from about 20° C. to about 105° C. In a preferred embodiment the temperature is conducted at from about 50° C. to about 105° C. A more preferred range is from about 80° C. to about 105° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° is useful. In a convection oven, evaporation may take from 15 minutes to one hour or more. The coating is rendered non-tacky and it is within the contemplation of this invention that the dried coating contains residual solvent in an amount of from about 1–30%, preferably 5–20% and more preferably 8–12% based on the weight of the dried coating. The coated substrate can then be exposed to actinic radiation especially ultraviolet radiation in any desired exposure pattern, produced by use of suitable masks, negatives, stencils, templates, etc., in a manner well known to the skilled artisan.

The exposed resist-coated substrates are next substantially immersed in an aqueous alkaline developing solution. The solution is preferably agitated, for example, by nitrogen burst agitation. Suitable developers non-exclusively include water solutions containing an alkali hydroxide, ammonium hydroxide or tetramethyl ammonium hydroxide. However, any other suitable developer known to the skilled artisan may be employed. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. This post exposure baking or heat treatment may be conducted at from about 95° C. to about 160° C., preferably 95° C. to 150° C., more preferably 112° C. to 120° C. This heating treatment may be conducted with a hot plate system for from about 10 seconds to the time necessary to crosslink the resin. This normally ranges from about 10 seconds to 90 seconds, more preferably from about 30 seconds to about 90 seconds and most preferably from 15 to 45 seconds. Durations for longer than 90 seconds are possible but do not generally provide any additional benefit. Longer times are required for convection oven baking. The time selected depends on the choice of composition components and the substrate used. In industrial applications, particularly in the manufacture of microcircuitry units on silicon/silicon dioxide-type substrates, the developed substrates may be treated with a buffered, hydrofluoric acid base etching solution or gas plasma. The resist compositions of the present invention are resistant to acid-base etching solutions and gas plasma etching and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Two photoresist formulations are prepared as follows:

| Resist A | | Resist B | |
| --- | --- | --- | --- |
| Novolak Resin | 23.8% | Novolak Resin | 23.8% |
| Photoactive component (Lot A) | 7.0% | Photoactive component (Lot A) | 7.0% |
| Control solvent composition comprising 10% xylene, 10% butyl acetate and 80% Cellosolve acetate | 69.2% | Propylene glycol methyl ether acetate | 69.2% |

The photoactive component is the condensation product of naphthoquinone-(1,2)-diazido-(2)5-sulfonyl chloride with trihydroxybenzophenone. The absorptivity of Resist A is 1.31 and the absorptivity of Resist B is 1.33, confirming that the photoactive component level in each case is the same. The novolak resin and photoactive component used in each case are the same. The resin is dissolved into the solvent by overnight stirring, the photoactive component is then dissolved and the solution passed through 0.2 um Millipore Teflon filters.

Evaluation for Photosensitivity

The photoresist is spin-coated on several wafers at a constant, predetermined spinspeed. The wafers are then baked at 90° C. for 0 minutes. The initial film thicknesses of coated resist are measured by a Rudolf Research Corporation film thickness monitor. Photosensitivity is measured by generating a contrast curve as described (G. C. Willson, in "Introduction to Microlithography", Chapter 3, p.105, American Chemical Society, Washington, D.C. 983). One plots film thickness loss after one minute development versus the logarithm of the UV exposure dose. Film thickness is monitored by laser interferometry using the technique described The resist was then developed using AZ Developer, available from American Hoechst Corporation, Somerville, N.J., diluted 1:1 with deionized water, at 25.0 ±0.5° C. By extrapolation of the plot to total film thickness loss, one obtains the photosensitivity value (mJ/cm$^2$) and the slope of this plot is the contrast. The results below were obtained for Resists A and B.

|  | Resist A | Resist B |
| --- | --- | --- |
| Photosensitivity (mJ/cm$^2$) | 111.6 | 97.2 |
| Contrast | 1.52 | 1.54 |
| Initial Film Thickness | 1.811 | 1.797 |

The results show that Resist B gives 15% improvement in photospeed in a formulation for comparable film thicknesses. There is no appreciable loss in contrast.

Erosion Rate

The rate of loss of the resist film in the unexposed areas upon development (erosion rate) should be kept low to retain edge acuity. The lower the erosion rate, the lower the amount of light required for exposure Erosion rate is measured by developing an unexposed, baked (90° for 30 minutes) resist film for ten minutes in the developer diluted 1:1 with deionized water, and calculating the film thickness loss per minute. Below are the results for the A and B Resist.

|  | Resist A | Resist B |
| --- | --- | --- |
| Erosion Rate (°A/min.) | 17 | 10 |

Resist B has an erosion rate at least comparable to Resist A.

EXAMPLE 2

Enamel 1 is repeated using a different lot of the same photoactive component (Lot B).

| Resist C |  | Resist D |  |
| --- | --- | --- | --- |
| Novolak Resin | 23.3% | Novolak Resin | 23.3% |
| Photoactive component (Lot B) | 6.9% | Photoactive component (Lot B) | 6.9% |
| Control solvent composition comprising 10% xylene, 10% butyl acetate and 80% Cellosolve acetate | 69.8% | Propylene glycol methyl ether acetate | 69.8% |

The bake time of the wafers after spin-coating is varied and photosensitivity and contrast measured as indicating in Example 1 above.

| Bake times, 90° C. (minutes) | Resist C | | Resist D | |
| --- | --- | --- | --- | --- |
|  | Photo-sensitivity (mJ/cm$^2$) | Constrast | Photo-sensitivity (mJ/cm$^2$) | Constrast |
| 10 | 92 | 1.72 | 84 | 1.74 |
| 25 | — | — | 92 | 1.63 |
| 30 | 103 | 1.66 | 93 | 1.64 |
| 30 | 103 | 1.59 | 89 | 1.65 |

The photospeed of Resist D is improved, from 9 to 16% in the cases cited.

Flash Points of Resists

A higher flash point is a desirable property for safety. The flash points of Resist C and D were compared by ASTM Test (D93, Method A).

|  | Flash Point |
| --- | --- |
| Resist C | 106° F. |
| Resist D | 118° F. |

The Resist D shows a considerable improvement in flash point.

Plasma Etch Rate

The plasma etch rate of a resist film should be kept as low as possible for dry processing. For this plasma etch rate test, the coated resist samples are baked 140° C. for 30 minutes, as is typically by called a "hard bake". Below are the plasma etch rates comparing Resists C and D. Conditions are 150 w. power, 0.6 Torr pressure, 95/5 CF$_4$/O$_2$ ratio, 60 SCCM O$_2$ flow rate.

|  | Etch Rate (°A/min.) |
| --- | --- |
| Resist C | 334 |
| Resist D | 313 |

The plasma etch rate of Resist D is at least comparable to Resist C.

Depth of Penetration Test

Another measure of positive resist sensitivity is the Depth of Penetration (DOP) Test, described by D. J. Elliot, in "Integrated Circuit Fabrication Technology", Chapter 13, p.325, McGraw Hill Book Company, N.Y. (1982). The test measures the resist film thickness removed after development with a measured dose of UV light. The greater the film thickness removed for a given dose of UV light, the higher the sensitivity. Below are the results using AZ Developer, diluted 1:1 with deionized water.

| Dose (mJ/cm$^2$) | Resist A (μm) | Resist B (μm) |
| --- | --- | --- |
| 15.0 | 0.45 | 0.53 |
| 22.0 | 0.75 | 0.80 |

-continued

| Dose (mJ/cm²) | Resist A (μm) | Resist B (μm) |
|---|---|---|
| 26.0 | 0.95 | 1.07 |
| 31.0 | 0.10 | 1.44 |
| 36.5 | 1.35 | 1.58 |

Resist B is shown to have greater photosensitivity by this test.

Spin Curve Characteristics

Spin curves are used to predetermine the thickness of baked resist film from the spin speed of application. These curves must therefore be regular, generating a straight line when plotted as log film thickness versus log spin speed. The two resists, Resists C and D, are each spun at various spin speeds as indicated below, baked at 90° C. for 30 minutes, and resist film thickness measured.

| RPM | Resist C (μm) | Resist D (μm) |
|---|---|---|
| 2,000 | 2.47 | 2.79 |
| 3,000 | 1.99 | 2.28 |
| 4,000 | 1.77 | 1.95 |
| 5,000 | 1.51 | 1.74 |
| 6,000 | 1.38 | 1.60 |
| 7,000 | 1.28 | 1.47 |

When plotted as indicated, each resist generates a linear curve with high correlation. Since Resist D has a higher viscosity than Resist C (29.6 cSt versus 37.8 cSt), the two curves are displaced from each other. However, each resist generates a well-behave spin curve required for predicting coating thickness.

EXAMPLE 3

Example 1 is repeated using a mixed solvent system for Resist B.

| Resist A | | Resist B | |
|---|---|---|---|
| Novolak Resin | 23.8% | Novolak Resin | 23.8% |
| Photoactive component | 7.0% | Photoactive component | 7.0% |
| Control solvent composition comprising 10% xylene, 10% butyl acetate and 80% Cellosolve acetate | 69.2% | Solvent composition comprising 10% xylene, 10% butyl acetate and 80% Propylene glycol methyl ether acetate | 69.2% |

| | Resist A | Resist B |
|---|---|---|
| Photosensitivity (mJ/cm²) | 111.6 | 98.2 |
| Contrast | 1.52 | 1.54 |
| Initial Film Thickness | 1.811 | 2.170 |

The results show that Resist B gives a 12% improvement in photospeed in a formulation even when the propylene glycol methyl ether acetate is used in conjunction with other solvents. This is especially unexpected since Resist B has a significantly greater film thickness.

EXAMPLE 4

Example 1 is repeated except the use of an additional plasticizer is demonstrated.

| Resist A | | Resist B | |
|---|---|---|---|
| Polymethyl vinyl ether | 15.43% | Polymethyl vinyl ether | 15.43% |
| Novolak Resin | 20.12% | Novolak Resin | 20.12% |
| Photoactive component | 5.96% | Photoactive component | 5.96% |
| Control solvent composition comprising 10% xylene, 10% butyl acetate and 80% Cellosolve ether acetate | 58.5% | Propylene glycol methyl ether acetate | 58.5% |

| | Resist A | Resist B |
|---|---|---|
| Initial Film Thickness | 6.05 μm | 6.74 μm |
| Photosensitivity (mJ/cm²) | 114.85 | 100.0 |

The results show that Resist B gives a 14.85% improvement in photospeed in comparable formulations containing a plasticizer (polymethyl vinyl ether).

What is claimed is:

1. A positive photoresist composition consisting essentially of, in admixture, from about 15% to about 99% by weight, based on the solid parts of said composition, of at least one novolak resin, about 1% to about 85% by weight, based on the solid parts of said composition, of at least one o-quinone diazide photosensitizer, and a sufficient amount of propylene glycol alkyl ether acetate to increase the photospeed of said composition.

2. The positive photoresist composition of claim 1 wherein said acetate is propylene glycol methyl ether acetate.

3. The positive photoresist composition of claim 2 wherein said o-quinone diazide photosensitizer is present in an amount of from about 10% to about 50% by weight, based on the solid parts of said composition.

4. The positive photoresist composition of claim 3 wherein said novolak resin is present in an amount of from about 50% to about 90% by weight, based on the solid parts of said composition.

5. The positive photoresist composition of claim 4 wherein said novolak resin is present in an amount of from about 65% to about 85% by weight, based on the solid parts of said composition, and wherein said o-quinone diazide photosensitizer is present in an amount of from about 15% to about 35% by weight, based on the solid parts of said composition.

6. The positive photoresist composition of claim 1 further comprising one or more additives selected from the group consisting of colorants, anti-striation agents, plasticizers, adhesion promoters, speed enhancers, and surfactants.

7. The positive photoresist composition of claim 1 wherein the amount of propylene glycol alkyl ether acetate present does not substantially effect development contrast.

8. The positive photoresist composition of claim 7 wherein said acetate is propylene glycol methyl ether acetate.

9. A photosensitive element which consists essentially of a substrate and the positive photoresist composition of claim 1 disposed on said substrate.

10. The element of claim 9 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

11. A photosensitive solution suitable for application to a substrate to form a positive photoresist, which consists essentially of at least one novolak resin, at least one o-quinone diazide photosensitizer in an amount sufficient to act as a dissolution rate inhibitor with respect to said resin, and a propylene glycol alkyl ether acetate in an amount sufficient to act as a solvent for said resin and photosensitizer and to facilitate application of said resin and photosensitizer to said substrate.

12. The solution of claim 11 wherein said acetate is propylene glycol methyl ether acetate.

13. A photosensitive solution suitable for application to a substrate to form a positive photoresist consisting essentially of, in admixture, from about 15% to about 99% by weight, based on the solid parts of said solution, of at least one novolak resin, about 1% to about 85% by weight, based on the solid parts of said solution, of at least one o-quinone diazide photosensitizer, and from about 40% to about 90% by weight, based on the overall weight of the solution, of a propylene glycol alkyl ether acetate.

14. The solution of claim 13 wherein said acetate is propylene glycol methyl ether acetate.

15. The solution of claim 14 wherein said o-quinone diazide photosensitizer is present in an amount of from about 10% to about 50% by weight, based on the solid parts of said solution.

16. The solution of claim 15 wherein said novolak resin is present in an amount of from about 50% to about 90% by weight, based on the solid parts of said solution.

17. The solution of claim 16 wherein said novolak resin is present in an amount of from about 65% to about 85% by weight, based on the solid parts of said solution, and wherein said o-quinone diazide photosensitizer is present in an amount of from about 15% to about 35% by weight, based on the solid parts of said solution.

18. The solution of claim 15 wherein said acetate is present in an amount of from about 65% to about 70% by weight, based on the overall weight of the solution.

19. The solution of claim 13 wherein said acetate is present in an amount of from about 60% to about 83% by weight, based on the overall weight of the solution.

20. The solution of claim 13 further comprising one or more additives selected from the group consisting of colorants, anti-striation agents, plasticizers, adhesion promoters, speed enhancers, and surfactants.

21. A substrate coated with the photosensitive solution of claim 13.

22. The coated substrate of claim 21 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

23. A photosensitive positive working composition suitable for use as a photoresist, which consists essentially of, in admixture, at least one novolak resin, at least one o-quinone diazide photosensitizer and a solvent which consists essentially of a sufficient amount of a propylene glycol alkyl ether acetate to increase the effective photospeed of the composition without a substantial effect on development contrast.

24. The photosensitive positive working composition of claim 23 wherein said acetate component is propylene glycol methyl ether acetate.

* * * * *